United States Patent [19]

Rutkoski

[11] 4,447,782

[45] May 8, 1984

[54] APPARATUS FOR AUTOMATIC MEASUREMENT OF EQUIVALENT CIRCUIT PARAMETERS OF PIEZOELECTRIC RESONATORS

[75] Inventor: John P. Rutkoski, Stow, Ohio

[73] Assignee: Transat Corp., Shaker Heights, Ohio

[21] Appl. No.: 359,060

[22] Filed: Mar. 17, 1982

[51] Int. Cl.$^3$ .......................... G01R 29/22; H03L 7/00
[52] U.S. Cl. ............................................ 324/56; 331/2; 324/79 R
[58] Field of Search ................... 324/56, 79 R, 79 D, 324/57 Q; 331/2, 25, 30, 31; 455/260; 29/25.35

[56] References Cited

U.S. PATENT DOCUMENTS

| | | | |
|---|---|---|---|
| 3,840,804 | 10/1974 | Sauerland | 324/56 |
| 3,921,087 | 11/1975 | Vosteen | 324/79 X |
| 3,986,113 | 10/1976 | Vifian | 331/25 X |

OTHER PUBLICATIONS

"Implementation of an Automatic Microcircuit Measuring System for Quartz Crystals", G. J. Malinowski et al., Proc. 35th Annual Frequency Control Symposium (1981).
"Quartz Crystal Measurements by a Phase-Amplitude Method", W. D. Beaver et al., Proc. 33rd Frequency Control Symposium (1979).
"Implementation of Bridge Measurement Techniques for Quartz Crystal Parameters", E. Hafner et al. Proc. of the Frequency Control Symposium (1976).
"Automatic Microcircuit Bridge for Measurement on Quartz Crystal Units", G. Malinowski et al., Proc. of the Frequency Control Symposium (1978).
"Technical Committee No. 49: Piezoelectric Devices for Frequency Control and Selection", International Electrotechnical Commission (1971).
"Modular Crystal Test System", Advertising Brochure of Transat Corporation (1980).

Primary Examiner—Stanley T. Krawczewicz
Assistant Examiner—Jose M. Solis
Attorney, Agent, or Firm—Fay & Sharpe

[57] ABSTRACT

A heterodyne zero-phase detector (A) produces a phase output signal whose phase varies with the phase difference between a selectively variable test signal and the same selectively variable test signal as modified by being applied to a piezoelectric resonator (B). The heterodyne zero-phase detector includes a voltage controlled oscillator (16) for generating the selectively variable test signal, a first balanced mixer (32) for mixing the selectively variable test signal with a selectively variable heterodyne reference signal, a second balanced mixer (34) for mixing the selectively variable test signal as modified by the piezoelectric resonator with the variaable heterodyne reference signal, and a phase detector (50) for receiving the output of the balanced mixers to produce the phase output signal. A characteristic frequency locking feedback loop (C) feeds back the phase output signal to control the voltage controlled oscillator to vary the selectively variable test signal in such a manner that the phase output signal approaches zero. A fixed test frequency locking feedback loop (D) locks the fixed frequency test signal from the first and second balanced mixers to the preselected fixed frequency. The fixed test signal frequency locking feedback loop includes a variable heterodyne signal generator (70) and a heterodyne signal generator control (72) for controlling the heterodyne reference signal generator. The heterodyne reference signal generator is connected with one of the balanced mixers to receive one of the fixed frequency test signals therefrom and to adjust the heterodyne reference signal generator such that the frequency of the fixed frequency test signal is held at the preselected fixed frequency. In this manner, the heterodyne reference signal is held to the variable test signal offset by a multiple of the preselected fixed frequency.

8 Claims, 1 Drawing Figure

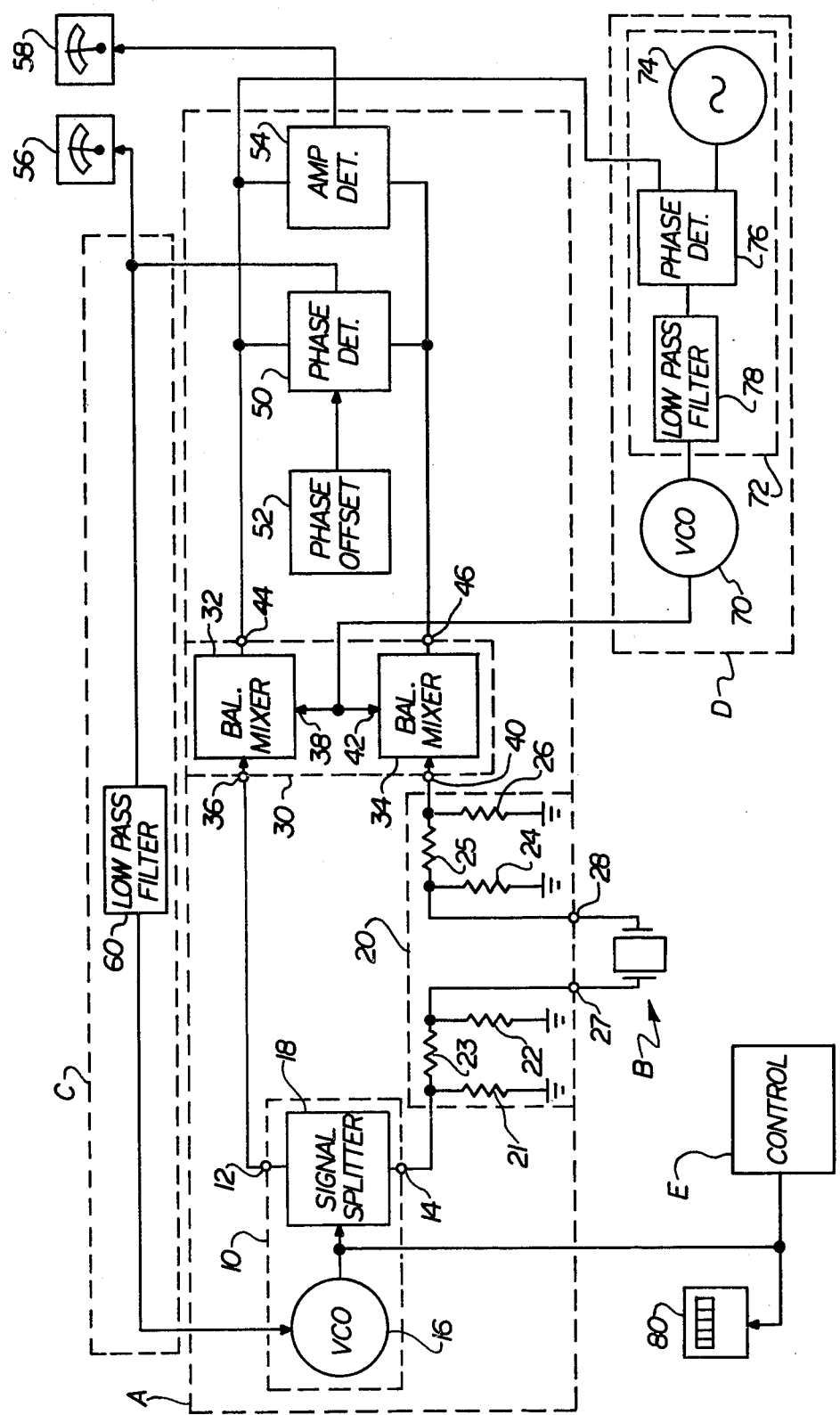

APPARATUS FOR AUTOMATIC MEASUREMENT OF EQUIVALENT CIRCUIT PARAMETERS OF PIEZOELECTRIC RESONATORS

BACKGROUND OF THE INVENTION

The invention relates to measuring equivalent circuit parameters of piezoelectric resonators by the so-called transmission method. In this method a variable frequency test signal is applied to a transmission network containing the resonator, and the resonator parameters are determined from measurements of the transmitted signal. The transmission network comprises passive components and may have different forms. For example a widely used network is called Pi network which comprises a number of resistors and places the resonator in series with the transmission path. Further, the test signal is frequently split into two channels, one a reference channel applied directly to a first input of a phase/amplitude meter, the other a test channel connected to a second input of the same phase/amplitude meter via the transmission network.

The transmission method is widely used for parameter measurements of quartz crystal resonators and is documented in many publications, some of which are listed in the attached prior art statement.

The method is implemented in various configurations. The ones known to this author are:

1. The basic system for manual measurement comprises a signal generator, a phase/amplitude detector, a frequency counter, and a transmission network containing the resonator.

2. In a modification of configuration 1, if the signal generator is D.C. controllable and the phase detector output connected to control the generator frequency f, the system can be phase-locked to the resonator frequency.

3. In a modification of configuration 2, the phase detector is a balanced mixer connected as a 90° phase detector. In this case the two signal channels to the phase detector must always have a 90° phase difference. This system is relatively simple but impractical if the measurement frequencies are changed often.

4. In another modification of configuration 2, if the signal generator and phase/amplitude detector are microprocessor controllable, the measurements can be automated by adding a controller and software.

5. In another modification of configuration 1, two programmed synthesizers are used, one producing a test frequency f, the other an offset frequency differing from f by IF, where IF is a constant intermediate frequency. The synthesizers are synchronized by microprocessor control. The test and reference channels are connected to the RF input of two balanced mixers. The offset frequency is applied to the local oscillator inputs of both mixers. The phase and amplitude relationship of the RF mixer inputs is retained in and measured at the IF mixer outputs. The measurement is simplified since it occurs at a constant and convenient frequency.

6. In a "Tracking Servobridge Detector", the test signal of frequency f from the RF generator is applied via a bridge circuit containing the resonator to the RF input of a first balanced mixer; the reference channel is applied to the RF input of a second balanced mixer. The "local oscillator" input of both mixers are connected to an offset frequency generator providing a frequency differing from f by IF, where IF is a constant intermediate frequency. The offset frequency is generated from the RF signal f by a single sideband generator. The phase and amplitude relationships of the RF mixer inputs is retained in the IF outputs, which are applied to the phase detector whose output is connected to control the RF generator frequency f, thereby making automatic phase lock to the resonator frequency possible.

Presently a major application of transmission methods is in the measurement of quartz crystal resonators. Desired features for this application include: accuracy of better than 1 part per million; frequency range of 1-250 MHz; fast automatic frequency lock; fast and wide-range frequency search sweep; lock to fast changing resonator frequencies, such as encountered during resonator frequency adjustment; automatic measurement; automatic parameter evaluation; minimum complexity and cost.

All the described conventional configurations lack one or more of the desired features. Configurations 1, 2 and 3 lack in regard to automatic features. Configuration 3 is inconvenient and problematic for measurements at varying frequencies. Configuration 4 is based on interconnecting various commercially available instruments, where especially the phase/amplitude meter is complex and has a relatively narrow bandwidth that precludes a sweep that is both wide and fast. Configuration 5 is also relatively complex in that it uses two synthesizers. It appears to lack a sweep that is wide, continuous and fast. Configuration 6 has been under development since 1973 and appears unlikely to be used in practice because of its complexity.

The present invention contemplates a new and improved resonator parameter measurement apparatus which overcomes the above referenced problems.

SUMMARY OF THE INVENTION

In accordance with the present invention there is provided an apparatus for measuring a characteristic frequency of a piezoelectric resonator. The apparatus includes a selectively variable test signal generator for generating a test signal having a selectively variable frequency. An analog heterodyne reference signal generating means generates a selectively variable heterodyne reference signal. A heterodyne reference signal generator control means controls the heterodyne reference signal generating means in such a manner that the heterodyne reference signal frequency is the same as the instantaneous frequency of the test signal but offset by a preselected fixed intermediate frequency. A heterodyne means is connected with the variable test signal generating means directly and is adapted to be connected with the variable test signal generating means by way of the piezoelectric resonator whose characteristic frequency is to be measured. The heterodyne means is also connected with the analog heterodyne reference signal generating means. The heterodyne means produces a pair of fixed frequency test signals having the same phase relationship as the variable test signals received directly from the variable test signal generator and by way of the piezoelectric resonator and having the substantially preselected fixed frequency. In this manner the phase difference between the fixed frequency test signals varies as a function of the difference between the characteristic frequency of the piezoelectric resonator and the frequency of the variable frequency test signal. The analog heterodyne reference signal generator control means is operatively connected with one of the fixed frequency test signals.

In accordance with another aspect of the present invention, there is provided an apparatus for measuring a characteristic frequency of a piezoelectric resonator which includes a heterodyne zero-phase detector, a characteristic frequency locking feedback loop, and a fixed test signal frequency locking feedback loop. The heterodyne zero-phase detector produces a phase output signal which varies with the difference between the frequency of a selectively variable test signal and the characteristic frequency. The heterodyne zero-phase detector includes a selectively variable test signal generating means, a heterodyne means for converting the selectively variable test signal and the selectively variable test signal received by way of the piezoelectric resonator to a pair of fixed frequency test signals which have the same phase relationship as the phase relationship between the variable test signal and the variable test signal received by way of the piezoelectric resonator, and a phase detecting means which is operatively connected with the heterodyne means for determining the phase difference between the pair of fixed frequency test signals and for producing the phase output signal. The characteristic frequency locking feedback loop connects the phase detecting means and the variable frequency test signal generating means for varying the frequency of the variable frequency test signal in such a manner that the phase difference detected by the phase detecting means is driven towards a minimum. In this manner, the frequency of the variable frequency test signal generating means is driven toward the characteristic frequency. The fixed test signal frequency locking feedback loop is operatively connected with the heterodyne means for holding the frequency of the fixed frequency test signals substantially to the preselected fixed frequency.

A primary advantage of the present invention is that it provides desirable performance features—such as high accuracy, high measurement speed, wide operating frequency spectrum, wide, fast and continuous search sweep, lock to fast changing resonator frequencies—with a system of relatively low complexity.

Still further advantages of the present invention will become apparent upon reading and understanding the following detailed description of the preferred embodiment.

BRIEF DESCRIPTION OF THE DRAWINGS

The invention may take form in various components and arrangements of components. The figure is only for the purpose of illustrating a preferred embodiment of the invention and is not to be construed as limiting the invention.

THE FIGURE is a schematic diagram of an apparatus and circuit for measuring piezoelectric resonator equivalent circuit parameters in accordance with the present invention.

DETAILED DESCRIPTION OF THE PREFERRED EMBODIMENT

A heterodyne zero-phase detector A produces a phase output signal that varies as the phase difference between a selectively variable test signal per se and the same selectively variable test signal as modified by being transmitted through a piezoelectric resonator B whose equivalent circuit parameters are to be measured. A characteristic frequency locking feedback loop C feeds back the phase output signal to vary the selectively variable test signal in such a manner that the phase difference is minimized. A fixed test signal frequency locking feedback loop D locks a fixed frequency test signal which is utilized in the heterodyne zero-phase detector to a preselected fixed frequency. Optionally, a control means E is connected with the heterodyne zero-phase detector for controlling a crystal plating or other resonator frequency adjustment operation.

The heterodyne zero-phase detector A includes a selectively variable frequency test signal generating means 10 for generating the same test signal on first and second outputs 12 and 14. The test signal has the same frequency, the same amplitude, and the same phase on both outputs. The variable test signal generating means includes a variable frequency oscillator 16 such as a voltage controlled oscillator or the like. A signal splitter 18 splits the selectively variable frequency test signal from the test signal oscillator 16 between the two outputs, 12 and 14.

A passive network 20 is connected with the second test signal output 14 for selectively connecting the piezoelectric resonator B with the second test signal output. In one embodiment, the passive network is a pi network which includes resistive elements 21-26 and a pair of connection terminals 27 and 28 for selectively connecting the piezoelectric resonator B in series with the second test signal output. Alternately, T networks, L networks, and the like may be used.

A heterodyne means 30 converts the pair of variable frequency test signals from the first test signal output 12 and from the passive network 20 to a pair of fixed frequency test signals having the same phase and amplitude relationship as the variable frequency test signals. The heterodyne means includes a first balanced mixer or heterodyne conversion transducer 32 and a second balanced mixer or heterodyne conversion transducer 34. The first balanced mixer 32 has a first or radio frequency input 36 which is connected with the first test signal output 12 and a second or local oscillator input 38 for receiving a heterodyne reference signal. The second balanced mixer 34 has a first or radio frequency input 40 which is connected to the second test signal output 14 by way of the passive network 20 and a second or local oscillator input 42 for receiving the heterodyne reference signal. The first and second balanced mixers have outputs 44 and 46 which carry the fixed frequency test signals.

A phase detecting means 50 is connected with the balanced mixer outputs for receiving the pair of fixed frequency test signals therefrom. The phase detecting means 50 determines the phase difference between the fixed frequency test signals and produces a phase output signal whose amplitude varies generally with the detected phase difference. A phase offset adjustment means 52 is connected with the phase detector for selectively shifting the zero-phase response of the phase detecting means 50. This enables the phase detecting means 50 to detect other phase relationships between the two fixed frequency test signals, such as a 45° phase shift, which may be useful in determining various equivalent circuit parameters of the tested piezoelectric resonator. In the preferred embodiment, an amplitude detecting means 54 is connected with the balanced mixer outputs for detecting the amplitude difference between the pair of fixed frequency test signals. The amplitude difference, corresponding to the voltage drop across the piezoelectric resonator, is used to determine equivalent circuit parameters of the piezoelectric resonator. A phase difference display 56 is connected with the output of the phase detecting means 50 to produce a visual indication of the phase difference between the fixed test signals. An amplitude difference indicator 58 is connected with the amplitude detecting means to provide a visual indication of the amplitude difference between the fixed frequency test signals.

The characteristic frequency locking feedback loop C connects the phase output signal with the selectable test frequency oscillator 16 to change the selectable frequency in proportion to the phase output signal. In the preferred embodiment, the phase detector output signal is a DC voltage which varies in relation to the phase difference of the fixed frequency test signals, and the selectable frequency signal generator 16 is a voltage controlled oscillator. The characteristic frequency locking feedback loop connects the phase output signal with the voltage control input of the voltage controlled oscillator. A positive, non-zero phase output signal increases the frequency of the voltage controlled oscillator. In this manner, the selectable frequency of the voltage controlled oscillator continues to increase until the phase output signal goes to zero. When the phase output signal goes to zero, the voltage controlled oscillator has reached the resonance frequency of the piezoelectric resonator. The characteristic frequency locking feedback loop C includes a low pass filter 60 which filters out high frequency components and inhibits the system from establishing a natural oscillation mode. The filter 60 also limits the speed with which the phase output signal can cause the voltage controlled oscillator frequency to change and controls the tendency for the voltage controlled oscillator to overshoot the resonance frequency.

The fixed test signal frequency locking feedback loop D includes a heterodyne reference signal generating means 70 for generating the appropriate heterodyne reference signal and a heterodyne reference signal generator control means 72 to maintain the frequency of the fixed test signal at the balanced mixer outputs 44 and 46 substantially at the preselected fixed frequency. The heterodyne reference signal generator control means includes a fixed, intermediate frequency signal generating means 74 which generates a fixed reference signal at the preselected fixed frequency. A frequency comparing means such as a heterodyne reference generator phase detector 76 is connected with the fixed frequency signal generating means 74 and one of the balanced mixer outputs to determine the frequency or phase difference between these signals. The heterodyne reference generator phase detector produces an output signal which varies with the phase difference of these two input signals. In the preferred embodiment, the heterodyne reference phase detector output is a DC voltage which varies in proportion to the phase difference between its two input signals. The heterodyne reference phase detector output is connected through a low pass filter 78 to the heterodyne reference frequency generating means 70, in the preferred embodiment a voltage controlled oscillator. The output of the heterodyne reference signal generating means is connected with the local oscillator inputs 38 and 42 of the balanced mixers. In this manner, if the frequency of one of the fixed frequency test signals varies from the preselected frequency of the fixed frequency oscillator 74, the heterodyne reference phase detector adjusts the heterodyne reference signal generating means 70 to bring the fixed frequency test signal back into conformity with the preselected fixed test signal frequency.

The variable test frequency oscillator 16 is connected with a frequency indicating means 80 for providing a visual display of the current frequency of the test signal oscillator. When the present invention is used to measure the resonance frequency of a piezoelectric resonator, the frequency indicator 80 moves quickly, generally a fraction of a second, to the resonance frequency at which a steady state operating condition is established.

In operation, the variable test frequency oscillator 16 is initialized to oscillate at a frequency below the resonance frequency of the piezoelectric resonator to be measured. Because the frequency of the variable test signal does not match the resonance frequency of the resonator, the signals received by the balanced mixers 32 and 34 have different phases and amplitudes. The balanced mixers convert the variable test signals to a pair of fixed frequency test signals which have the same amplitude and phase relationship. The phase detecting means 50 produces a phase output signal which varies with the phase difference of the two fixed frequency test signals. The phase detector output signal is fed back by the characteristic frequency locking feedback loop C to the variable test signal oscillator 16 causing it to increase its oscillation frequency. Simultaneously, the heterodyne reference phase detector 76 compares the frequency of the fixed frequency test signal with the fixed frequency oscillator 74. If there is a difference in the frequencies of the fixed frequency test signal and the fixed frequency oscillator, the heterodyne reference phase detector 76 changes the frequency of the heterodyne reference signal oscillator 70 until they are brought into conformity. Thus, as the characteristic frequency locking feedback loop increases the frequency of the test frequency oscillator, the fixed test signal frequency locking loop D adjusts the frequency of the heterodyne reference signal. In this manner, the frequency difference between the variable frequency test signal and the heterodyne reference signal is held substantially to the preselected fixed frequency. When the variable reference frequency oscillator reaches the resonance frequency of the piezoelectric resonator, the signals received by the two balanced mixers will have the same phase relationship, as will the two signals received by the phase detecting means 50. This changes the phase output signal to zero, stopping the variable frequency test signal oscillator 16 from changing its frequency. If the variable frequency test signal oscillator should overshoot the resonance frequency slightly, the sign of the phase output signal reverses, reducing the test oscillator frequency toward the resonance frequency. If the resonator is undergoing a frequency adjusting operation, any change in the resonance frequency causes a phase difference which in turn causes the phase output signal to adjust the frequency of the test signal oscillator to hold it to the changing resonance frequency.

The invention has been described with reference to the preferred embodiment. Obviously, modifications and alterations will occur to others upon reading and understanding the preceeding detailed description of the preferred embodiment. It is intended that the invention be construed as including all such alterations and modifications which come within the scope of the appended claims or the equivalents thereof.

Having thus described a preferred embodiment of my invention, I now claim my invention to be:

1. An apparatus for measuring a characteristic frequency of a piezoelectric resonator comprising:

a variable frequency test signal generating means for generating a variable frequency test signal;

an analog heterodyne reference signal generating means for generating a selectively variable heterodyne reference signal;

heterodyne means for receiving the variable frequency heterodyne reference signal, the selectively variable test signal, and the selectively variable test signal received by way of the piezoelectric resonator whose characteristic frequency is to be measured, the heterodyne means producing a pair of fixed frequency test signals which have substantially the preselected fixed frequency and whose phase relationship is the same as the phase relationship between the signals received by the heterodyne means, whereby the phase difference between the fixed frequency test signals varies as a function of the difference between the characteristic frequency of the piezoelectric resonator and the frequency of the variable frequency test signal;

heterodyne reference signal generator control means operatively connected with one of the fixed frequency test signals for controlling the heterodyne reference signal generating means such that the frequency of the variable heterodyne reference signal is the frequency of the variable frequency test signal offset by a preselected fixed frequency;

phase detecting means operatively connected with the fixed frequency test signals for producing a phase output signal which varies with the phase difference between the fixed frequency test signals.

2. The apparatus as set forth in claim 1 wherein the heterodyne reference frequency generator control means includes a preselected fixed frequency oscillator and means for comparing the frequency of the preselected fixed frequency oscillator and one of the fixed frequency test signals, the heterodyne reference signal generating means being controlled by the frequency comparing means to adjust the heterodyne reference frequency such that the frequency of the fixed frequency test signal and of the preselected fixed frequency oscillator are driven toward conformity.

3. The apparatus as set forth in claim 2 wherein the frequency comparing means is a frequency-phase detector.

4. The apparatus as set forth in claim 3 further including a characteristic frequency locking feedback loop operatively connected between the phase detecting means output and the selectively variable test frequency generating means for adjusting the frequency of the selectively variable test signal generating means in such a manner that the phase output signal is driven toward zero.

5. The apparatus as set forth in claim 4 further including amplitude detecting means connected with the heterodyne means for producing an output signal which varies with the amplitude difference between the fixed frequency test signals.

6. An apparatus for measuring a characteristic frequency of a piezoelectric resonator comprising:

a heterodyne zero-phase detector for producing a phase output signal which varies with the difference between the frequency of a selectively variable test signal and the characteristic frequency, the heterodyne zero-phase detector including:

a selectively variable test signal generating means;

heterodyne means for converting the selectively variable test signal and the selectively variable test signal received by way of the piezoelectric resonator whose characteristic frequency is being measured to a pair of fixed frequency test signals, the pair of fixed frequency test signals having the same phase relationship as the phase relationship between the variable frequency test signal and the variable frequency test signal received by way of the piezoelectric resonator;

a phase detecting means operatively connected with the heterodyne means for determining the phase difference between the pair of fixed frequency test signals and for producing the phase output signal;

a characterisitc frequency locking feedback loop connected between the phase detecting means and the variable frequency test signal generating means for varying the frequency of the variable frequency test signal generating means in such a manner that the phase difference detected by the phase detecting means is driven towards a minimum, whereby the frequency of the variable frequency test signal generating means is driven toward the characteristic frequency; and, a fixed test signal frequency locking feedback loop including a preselected fixed frequency signal generating means for generating a fixed frequency reference signal having the preselected fixed frequency, frequency comparing means operatively connected with the fixed frequency generating means and with the heterodyne means for comparing the fixed frequency reference signal and the fixed frequency test signal, and a variable heterodyne reference signal generator for generating a variable heterodyne reference signal which has substantially the variable test signal frequency offset by an integral multiple of the preselected fixed frequency, the variable heterodyne reference signal generator being controlled by the frequency comparing means and being operatively connected with the heterodyne means to supply the variable heterodyne reference signal thereto.

7. The apparatus as set forth in claim 6 wherein the heterodyne means includes a first balanced mixer for mixing the variable frequency test signal with the variable heterodyne reference signal to produce one of the fixed frequency test signals and a second balanced mixer for mixing the variable frequency test signal received by way of the piezoelectric resonator with the varable heterodyne reference signal to produce the other of the fixed frequency test signals.

8. The apparatus as set forth in claim 7 wherein the selectively variable test signal generating means includes a voltage controlled oscillator which is controlled by the phase output signal.

* * * * *